(12) United States Patent
He et al.

(10) Patent No.: US 8,741,744 B2
(45) Date of Patent: Jun. 3, 2014

(54) METHOD OF FORMING A GATE PATTERN AND A SEMICONDUCTOR DEVICE

(75) Inventors: Qiyang He, Shanghai (CN); Yiying Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 151 days.

(21) Appl. No.: 13/240,637

(22) Filed: Sep. 22, 2011

(65) Prior Publication Data

US 2012/0235243 A1   Sep. 20, 2012

(30) Foreign Application Priority Data

Mar. 17, 2011   (CN) .......................... 2011 1 0064415

(51) Int. Cl.
*H01L 21/20* (2006.01)
*H01L 21/36* (2006.01)
*H01L 21/3205* (2006.01)
*H01L 21/4763* (2006.01)

(52) U.S. Cl.
USPC .................. 438/478; 438/585; 257/E21.409; 257/E21.309

(58) Field of Classification Search
USPC ............. 257/368, E21.409, E27.06; 438/585, 438/593
See application file for complete search history.

(56) References Cited

U.S. PATENT DOCUMENTS 6,042,998 A        3/2000  Brueck et al.
2003/0235789 A1 * 12/2003 Chang ........................... 430/312

* cited by examiner

*Primary Examiner* — George Fourson, III
*Assistant Examiner* — Wilner Jean Baptiste
(74) *Attorney, Agent, or Firm* — Koppel, Patrick, Heybl & Philpott; Michael J. Ram

(57) ABSTRACT

This disclosure is directed to a method of forming a gate pattern and a semiconductor device. The method comprises: providing a plurality of stacked structures which are parallel to each other and extend continuously in a first direction, and which are composed of a gate material bar and an etching barrier bar thereon; leaving second resist regions between gaps to be formed adjacent to each other across gate bars by a second photolithography process; selectively removing the etching barrier bars by a second etching process; forming a third resist layer having a plurality of openings parallel to each other and extending continuously in a second direction substantially perpendicular to the first direction by a third photolithography process; and forming the gate pattern by a third etching process. The method is capable of having a larger photolithography process window and better controlling the shape and size of a gate pattern.

18 Claims, 14 Drawing Sheets

METHOD OF FORMING A GATE PATTERN AND A SEMICONDUCTOR DEVICE

CROSS-REFERENCES TO RELATED APPLICATIONS

This application claims priority to Chinese Patent Application No. 201110064415.1, filed on Mar. 17, 2011, entitled "Method of Forming a Gate Pattern and a Semiconductor Device" by inventors Qiyang HE and Yiying ZHANG, commonly assigned, incorporated by reference herein for all purposes.

BACKGROUND OF THE INVENTION

1. Field of the Invention

This disclosure is directed to a method of forming a gate pattern and a semiconductor device having the gate pattern. This disclosure is particularly directed to a method of forming a staggered gate pattern and a semiconductor device having the gate pattern.

2. Description of the Related Art

In order to maximize the density of a semiconductor device, in particular the density of a gate, it is often required to form a staggered gate pattern. For example, this gate pattern includes a plurality of gate bars parallel to each other in a first direction, and each gate bar is broken up by gaps. Moreover, the gaps are located in a plurality of stripe zones parallel to each other in a second direction which is substantially perpendicular to the first direction, but the gaps in each stripe zone are not continuous, that is, there are gaps adjacent to each other across gate bars in each stripe zone.

In current semiconductor manufacturing processes, in order to form a staggered gate pattern, a double patterning technique is employed widely.

FIGS. 1A to 1B show trimming slots formed in a conventional double patterning technique and a gate pattern obtained by using the trimming slots. Referring to FIG. 1A, a mask having the trimming slots is disposed above a plurality of gate bars parallel to each other obtained after line etching. The positions of the trimming slots correspond to the positions of the gaps breaking up the gate bars. The positions of the trimming slots are staggered because a staggered gate pattern is to be formed. Next, referring to FIG. 1B, a staggered gate pattern is formed after trimming slot etching is performed on the gate bars.

FIGS. 2A to 2D specifically show a method of forming a staggered gate pattern by employing a conventional double patterning technique.

First, as shown in FIG. 2A, a resist pattern 210 having a plurality of openings is formed by a first photolithography process, the plurality of openings being parallel to each other and extending continuously. Next, as shown in FIG. 2B, a first etching process is performed by using the resist pattern 210 as a mask so as to form a plurality of gate material bars 260 on a substrate 250, the plurality of gate material bars 260 being parallel to each other and extending continuously. Then, as shown in FIG. 2C, a resist pattern 220 having trimming slots is formed by a second photolithography process. Finally, as shown in FIG. 2D, a second etching process is performed by using the resist pattern 220 as a mask so as to form staggered gaps in the gate material bars 260 on the substrate 250, thereby forming the staggered gate pattern.

FIGS. 3A to 3E specifically show another method of forming a staggered gate pattern by employing a conventional double patterning technique. This method additionally forms a hard mask layer on a gate material layer. After forming a staggered hard mask pattern by using a similar method, the hard mask pattern is transferred to the underlying gate material layer, thereby forming a staggered gate pattern.

First, as shown in FIG. 3A, a resist pattern 310 having a plurality of openings is formed by a first photolithography process, the plurality of openings being parallel to each other and extending continuously. Next, as shown in FIG. 3B, a first etching process is performed by using a resist pattern 310 as a mask so as to form a plurality of hard mask bars 370 on the gate material layer 360 on a substrate 350, the plurality of hard mask bars 370 being parallel to each other and extending continuously. Then, as shown in FIG. 3C, a resist pattern 320 having trimming slots is formed by a second photolithography process. Next, as shown in FIG. 3D, a second etching process is performed by using the resist pattern 320 as a mask so as to form staggered gaps in the hard mask bars 370 on the gate material layer 360 on the substrate 350, thereby forming a staggered hard mask pattern. Finally, as shown in FIG. 3E, a third etching process is performed by using the hard mask pattern as a mask so as to form the staggered gate pattern.

After forming the gate pattern (e.g., a polysilicon gate pattern) by using any one of the above methods, the material of the gate may be further replaced by a metal, thereby forming a staggered metal gate pattern.

The present inventors have conducted in-depth investigation on the above method of forming a staggered gate pattern, and have found that the following problems exist.

First, in deep submicron field, strict control is needed for the size of trimming slots, especially the longitudinal size H1 of trimming slots (referring to FIGS. 2C and 3C, which corresponds to the length of the gaps breaking up the gate bars), which makes the photolithography process window of trimming slots very small.

Second, in deep submicron field, corners of obtained trimming slots are rounded significantly due to the margin of trimming slot photolithography, i.e., the obtained trimming slots are not in desired rectangular shape (referring to FIG. 1A). Moreover, after trimming slot etching, corners of an obtained gate are sharp correspondingly rather than being desired right angles (referring to FIG. 1B). Thus, the shape and size of a gate pattern can not be precisely controlled, thereby causing an adverse effect on the performances of a semiconductor device. Further, if a metal gate structure is to be employed, the sharp corners of the gate make metal filling difficult when replacing the material of the gate with the metal, which also causes an adverse effect on the performances of the semiconductor device.

SUMMARY OF THE INVENTION

This disclosure is proposed in view of the above problems.

An object of one aspect of this disclosure is to provide a method of forming a gate pattern and a semiconductor device having the gate pattern, wherein the method of forming the gate pattern is capable of having a larger photolithography process window compared with prior art methods.

An object of another aspect of this disclosure is to provide a method of forming a gate pattern and a semiconductor device having the gate pattern, wherein the method of forming the gate pattern is capable of better controlling the shape and size of the gate pattern compared with prior art methods.

An object of yet another aspect of this disclosure is to provide a method of forming a gate pattern and a semiconductor device having the gate pattern, wherein the method of forming the gate pattern is capable of being applied to advanced semiconductor processes very well.

According to a first aspect of this disclosure, there is provided a method of forming a gate pattern, the gate pattern including a plurality of gate bars parallel to each other in a first direction, each gate bar being broken up by gaps, the gaps being located in a plurality of stripe zones parallel to each other in a second direction which is substantially perpendicular to the first direction, and there being the gaps adjacent to each other across the gate bars in each stripe zone, wherein the method comprises the following steps: providing, on a substrate, a plurality of stacked structures which are parallel to each other and extend continuously in the first direction, the stacked structure being composed of a gate material bar and an etching barrier bar thereon; forming a second resist layer on the substrate comprising the stacked structures; subjecting the second resist layer to a second photolithography process to selectively leave a plurality of second resist regions, respective second resist regions being located between the gaps to be formed adjacent to each other across the gate bars, respectively; selectively removing the etching barrier bars in the stacked structures by a second etching process with the second resist regions as a mask; forming a third resist layer on the substrate subjected to the second etching process; subjecting the third resist layer to a third photolithography process to form a plurality of openings parallel to each other and extending continuously in the second direction; and forming the gaps by a third etching process with the third resist layer subjected to the third photolithography process as a mask, thereby forming the gate pattern.

Preferably, the step of providing the stacked structures further comprises the following steps: forming an etching barrier layer and a first resist layer on a gate material layer on the substrate sequentially; subjecting the first resist layer to a first photolithography process to form a plurality of openings parallel to each other and extending continuously in the first direction; and forming the etching barrier layer and the gate material layer into the stacked structures by a first etching process with the first resist layer subjected to the first photolithography process as a mask.

Preferably, the method of forming the gate pattern further comprises the following step: replacing the material of the gate bars with a metal after forming the gate pattern.

Preferably, the first photolithography process is a photolithography process of a line/space type, the ratio of the line to the space is in a range of 1:5 to 5:1, and a pitch is in a range of 20 nm to 200 nm; and the third photolithography process is a photolithography process of a line/space type, the ratio of the line to the space is in a range of 1:5 to 5:1, and a pitch is in a range of 20 nm to 2000 nm.

Preferably, the shape of the second resist regions obtained by the second photolithography process is any one of square, rectangle, circle and ellipse.

Preferably, the first etching process, the second etching process and the third etching process are dry etching processes.

Preferably, the etching selecting ratio of the etching barrier layer to the gate material layer in the first etching process is in a range of 1:10 to 1:200; the etching selecting ratio of the gate material bars to the etching barrier bars in the second etching process is in a range of 1:10 to 1:50; and the etching selecting ratio of the etching barrier bars to the gate material bars in the third etching process is in a range of 1:10 to 1:200.

Preferably, the materials of the gate material bars and the etching barrier bars are polysilicon and silicon oxide, respectively.

Preferably, the number of the gate bars between the gaps adjacent to each other across the gate bars is 1 to 5.

According to a second aspect of this disclosure, there is provided a method of forming a gate pattern, the gate pattern including a plurality of gate bars parallel to each other in a first direction, each gate bar being broken up by gaps, the gaps being located in a plurality of stripe zones parallel to each other in a second direction which is substantially perpendicular to the first direction, and there being the gaps adjacent to each other across the gate bars in each stripe zone, wherein the method comprises the following steps: providing, on a gate material layer on a substrate, a plurality of stacked structures which are parallel to each other and extend continuously in the first direction, the stacked structure being composed of a hard mask bar and an etching barrier bar thereon; forming a second resist layer on the substrate comprising the stacked structures; subjecting the second resist layer to a second photolithography process to selectively leave a plurality of second resist regions, respective second resist regions being located between the gaps to be formed adjacent to each other across the gate bars, respectively; selectively removing the etching barrier bars in the stacked structures by a second etching process with the second resist regions as a mask; forming a third resist layer on the substrate subjected to the second etching process; subjecting the third resist layer to a third photolithography process to form a plurality of openings parallel to each other and extending continuously in the second direction; forming gaps in the hard mask bars by a third etching process with the third resist layer subjected to the third photolithography process as a mask; and forming the gate pattern by a fourth etching process with the hard mask bars subjected to the third etching process as a mask.

Preferably, the step of providing the stacked structures further comprises the following steps: forming a hard mask layer, an etching barrier layer and a first resist layer on the gate material layer on the substrate sequentially; subjecting the first resist layer to a first photolithography process to form a plurality of openings parallel to each other and extending continuously in the first direction; and forming the etching barrier layer and the hard mask layer into the stacked structures by a first etching process with the first resist layer subjected to the first photolithography process as a mask.

Preferably, the method of forming the gate pattern further comprises the following step: replacing the material of the gate bars with a metal after forming the gate pattern.

Preferably, the first photolithography process is a photolithography process of a line/space type, the ratio of the line to the space is in a range of 1:5 to 5:1, and a pitch is in a range of 20 nm to 200 nm; and the third photolithography process is a photolithography process of a line/space type, the ratio of the line to the space is in a range of 1:5 to 5:1, and a pitch is in a range of 20 nm to 2000 nm.

Preferably, the shape of the second resist regions obtained by the second photolithography process is any one of square, rectangle, circle and ellipse.

Preferably, the first etching process, the second etching process, the third etching process and the fourth etching process are dry etching processes.

Preferably, both the etching selecting ratio of the hard mask layer to the etching barrier layer and the etching selecting ratio of the gate material layer to the hard mask layer in the first etching process are in a range of 1:10 to 1:50; the etching selecting ratio of the hard mask bars to the etching barrier bars in the second etching process is in a range of 1:2 to 1:50; the etching selecting ratio of the etching barrier bars to the hard mask bars in the third etching process is in a range of 1:50 to 1:200; and the etching selecting ratio of the hard mask bars to the gate material layer in the fourth etching process is in a range of 1:10 to 1:200.

Preferably, the materials of the gate material layer, the hard mask bars and the etching barrier bars are polysilicon, silicon oxide and silicon nitride, respectively.

Preferably, the number of the gate bars between the gaps adjacent to each other across the gate bars is 1 to 5.

According to a third aspect of this disclosure, there is provided a semiconductor device having a gate pattern, the gate pattern including a plurality of gate bars parallel to each other in a first direction, each gate bar being broken up by gaps, the gaps being located in a plurality of stripe zones parallel to each other in a second direction which is substantially perpendicular to the first direction, and there being the gaps adjacent to each other across the gate bars in each stripe zone, wherein between the gaps adjacent to each other across the gate bars, etching barrier bars are formed on the gate bars.

According to each of the above aspects of this disclosure, since an etching barrier layer is introduced and the etching barrier layer is selectively left in advance between the positions where the gaps are to be formed, it is possible to form a plurality of incontinuous gaps in the same stripe zone integrally as one continuously extending gap, thereby changing the gate trimming pattern from a slot shape which is harder to be implemented by photolithography to a line/space shape which is easier to be implemented by photolithography. Compared with prior art methods, the method of this disclosure is capable of having a larger photolithography process window and is capable of better controlling the shape and size of the gate pattern, although it needs additional photolithography and etching steps (it can be called triple patterning technique since three photolithography steps are needed).

This disclosure is capable of being applied to advanced semiconductor processes very well.

BRIEF DESCRIPTION OF THE DRAWINGS

The accompanying drawings, which are incorporated in and constitute a part of the specification, illustrate embodiments of this disclosure and, together with the description, serve to explain the principles of this disclosure.

It is to be noted that, in the accompanying drawings, for convenience of description, the sizes of respective components may not be drawn based on actual scales.

FIGS. 1A-1B illustrate trimming slots formed in a conventional double patterning technique and a gate pattern obtained by using the trimming slots, wherein FIG. 1A illustrates a mask having the trimming slots disposed above a plurality of gate bars parallel to each other; and FIG. 1B illustrates a staggered gate pattern obtained after trimming slot etching.

FIGS. 2A-2D illustrate one method of forming a staggered gate pattern by employing a conventional double patterning technique, wherein FIG. 2A illustrates a resist pattern having a plurality of openings parallel to each other after a first photolithography process; FIG. 2B illustrates a plurality of gate bars parallel to each other after a first etching process; FIG. 2C illustrates a resist pattern having trimming slots after a second photolithography process; and FIG. 2D illustrates a staggered gate pattern after a second etching process.

FIGS. 3A-3E illustrate another method of forming a staggered gate pattern by employing a conventional double patterning technique, wherein FIG. 3A illustrates a resist pattern having a plurality of openings parallel to each other after a first photolithography process; FIG. 3B illustrates a plurality of hard mask bars parallel to each other after a first etching process; FIG. 3C illustrates a resist pattern having trimming slots after a second photolithography process; FIG. 3D illustrates a staggered hard mask pattern after a second etching process; and FIG. 3E illustrates a staggered gate pattern after a third etching process.

FIGS. 5A-5I are plan views and section views schematically illustrating respective steps in the method of forming the gate pattern according to the first embodiment of this disclosure, wherein FIG. 5A is a plan view illustrating a resist pattern having a plurality of openings parallel to each other after a first photolithography process; FIGS. 5B and 5C are a plan view and a section view (taken along the dotted line in FIG. 5B) illustrating a plurality of stacked structures parallel to each other after a first etching process respectively, the stacked structure being composed of a gate material bar and an etching barrier bar; FIG. 5D is a plan view illustrating a resist pattern after a second photolithography process; FIGS. 5E and 5F are a plan view and a section view (taken along the dotted line in FIG. 5E) illustrating the plurality of stacked structures after a second etching process, respectively; FIG. 5G is a plan view illustrating a resist pattern having a plurality of openings parallel to each other after a third photolithography process; and FIGS. 5H and 5I are a plan view and a section view (taken along the dotted line in FIG. 5H) illustrating a staggered gate pattern after a third etching process, respectively.

FIGS. 7A-7K are plan views and section views schematically illustrating respective steps in the method of forming the gate pattern according to the second embodiment of this disclosure, wherein FIG. 7A is a plan view illustrating a resist pattern having a plurality of openings parallel to each other after a first photolithography process; FIGS. 7B and 7C are a plan view and a section view (taken along the dotted line in FIG. 7B) illustrating a plurality of stacked structures parallel to each other after a first etching process respectively, the stacked structure being composed of a hard mask bar and an etching barrier bar; FIG. 7D is a plan view illustrating a resist pattern after a second photolithography process; FIGS. 7E and 7F are a plan view and a section view (taken along the dotted line in FIG. 7E) illustrating the plurality of stacked structures after a second etching process, respectively; FIG. 7G is a plan view illustrating a resist pattern having a plurality of openings parallel to each other after a third photolithography process; FIGS. 7H and 7I are a plan view and a section view (taken along the dotted line in FIG. 7H) illustrating a staggered hard mask pattern after a third etching process, respectively; and FIGS. 7J and 7K are a plan view and a section view (taken along the dotted line in FIG. 7J) illustrating a staggered gate pattern after a fourth etching process, respectively.

The objects, features and advantages of this disclosure will become apparent from the following detailed description of exemplary embodiments with reference to the accompanying drawings.

DESCRIPTION OF THE EMBODIMENTS

Exemplary embodiments of this disclosure will be described in detail below with reference to the accompanying drawings. It shall be noted that the following description is merely illustrative in nature. The components and steps set forth in the embodiments do not limit the scope of this disclosure unless it is otherwise specifically stated. In addition, techniques, methods and devices known by persons skilled in the art may not be discussed in detail, but are intended to be a part of the specification where appropriate.

First Embodiment

In the first embodiment of this disclosure, in order to form a staggered gate pattern, an etching barrier layer is formed on a gate material layer on a substrate and the etching barrier layer is selectively left in advance between the positions where the gaps are to be formed such that it is possible to form a plurality of incontinuous gaps in the same stripe zone integrally as one continuously extending gap, thereby changing the gate trimming pattern from a slot shape which is harder to be implemented by photolithography to a line/space shape which is easier to be implemented by photolithography. This makes the method of the first embodiment of this disclosure capable of having a larger photolithography process window and capable of better controlling the shape and size of the gate pattern.

Figure 4:
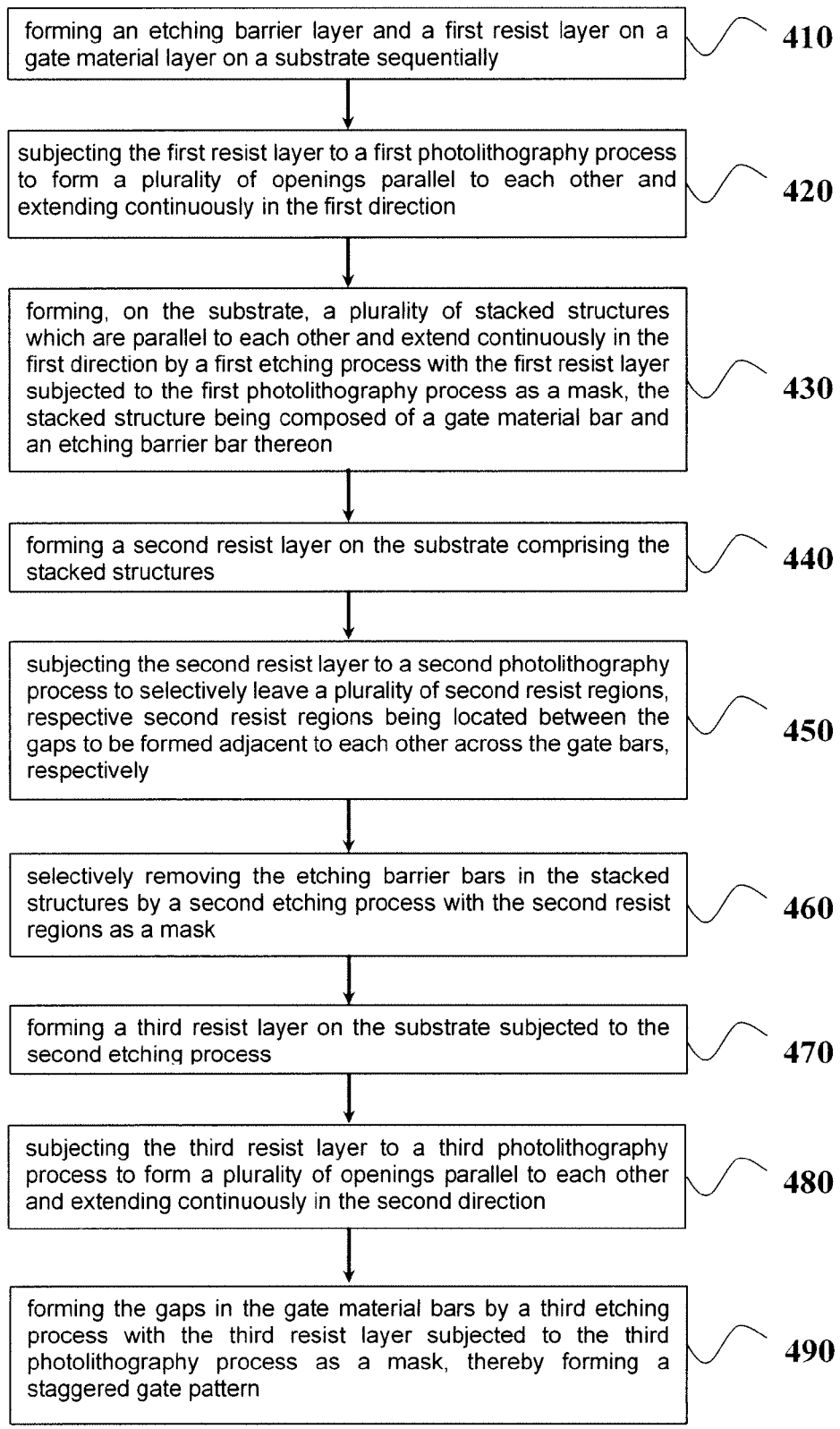
FIG. 4 schematically illustrates a flowchart of a method of forming a gate pattern according to a first embodiment of this disclosure.

FIG. 4 schematically illustrates a flowchart of the method of forming the gate pattern according to the first embodiment of this disclosure. FIGS. 5A-5I are plan views and section views schematically illustrating respective steps in the method of forming the gate pattern according to the first embodiment of this disclosure. The first embodiment of this disclosure will be described in detail with reference to FIG. 4 and FIGS. 5A-5I below.

First, a plurality of stacked structures which are parallel to each other and extend continuously in the first direction are provided on a substrate, the stacked structure being composed of a gate material bar and an etching barrier bar thereon. This can be obtained for example by steps 410-430 in FIG. 4.

Specifically, in step 410 of FIG. 4, an etching barrier layer and a first resist layer are formed on a gate material layer on the substrate sequentially. The substrate may be made of silicon for example, and a very thin gate oxide layer may be provided thereon (not shown in the drawings). The gate material layer may be made of polysilicon for example, and its thickness is 100 Å-1000 Å. The etching barrier layer may be made of silicon oxide for example, and its thickness is 50 Å-1000 Å.

Figure 5A:
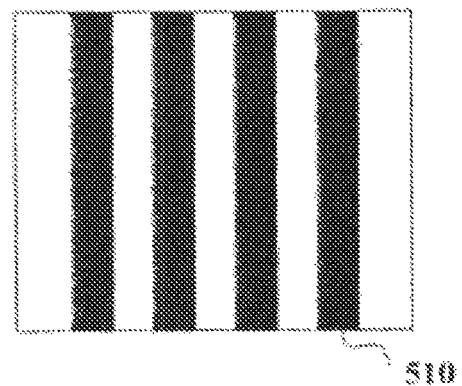

In step 420 of FIG. 4, the first resist layer is subjected to a first photolithography process to form a resist pattern 510 having a plurality of openings which are parallel to each other and extend continuously in the first direction (referring to FIG. 5A). The first photolithography process is a line/space type photolithography process, for example, a ratio of the line to the space is in a range of 1:5 to 5:1, and a pitch (i.e., a width of a minimum repeating unit composed of one line and one space) is in a range of 20 nm to 200 nm. A photolithography technique such as dry photolithography, emersion photolithography, Extreme Ultra-Violet (EUV) photolithography, electron beam photolithography or the like may be employed for the first photolithography process.

Figure 5B:
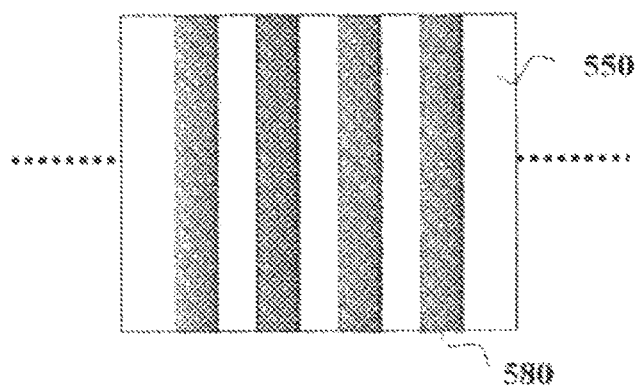
Figure 5C:
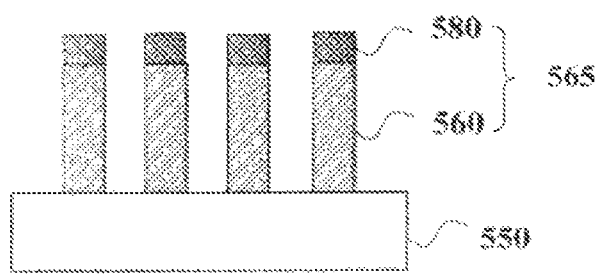

In step 430 of FIG. 4, the plurality of stacked structures 565 which are parallel to each other and extend continuously in the first direction are formed on the substrate by a first etching process with the resist pattern 510 as a mask, the stacked structure being composed of a gate material bar 560 and an etching barrier bar 580 thereon (referring to FIGS. 5B.about.5C). The first etching process is for example a standard dry etching process with a high etching selecting ratio, and the etching selecting ratio of the etching barrier layer to the gate material layer is for example in a range of 1:10 to 1:200.

Incidentally, after the first etching process, the resist pattern 510 may be ashed away in the same etching chamber. A standard process based on $O_2$ gas may be employed for the ashing for example. This can be applied to the following etching steps as well.

Incidentally, the middle of a pattern formed after the first etching process may be leveled off by using a leveling agent (such as BARC etc.), the leveling agent is ashed away after the next etching, and the middle of the pattern is leveled off again before a further next photolithography (not shown in the drawings).

Next, in step 440 of FIG. 4, a second resist layer is formed on the substrate comprising the stacked structures.

Figure 5D:
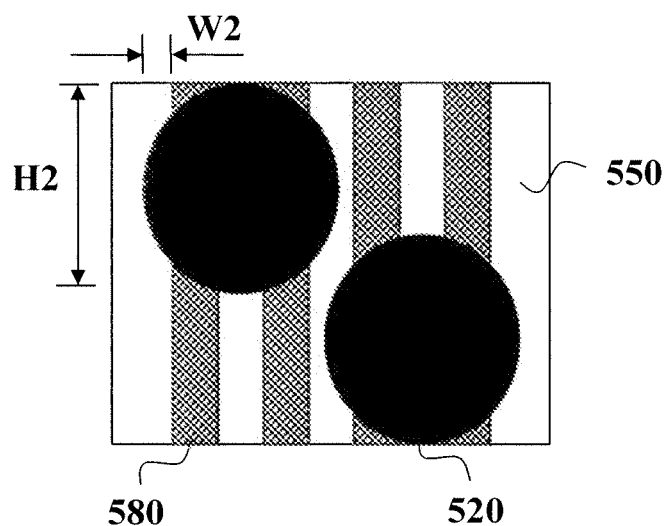

In step 450 of FIG. 4, the second resist layer is subjected to a second photolithography process to selectively leave a plurality of second resist regions 520, respective second resist regions 520 being located between the gaps to be formed adjacent to each other across the gate bars, respectively (referring to FIG. 5D). The stripe zones herein refer to the regions where the gaps breaking up the gate bars are located as described above. A photolithography technique such as dry photolithography, emersion photolithography, EUV photolithography, electron beam photolithography or the like may be employed for the second photolithography process. In addition, there is no particular limit to the shape of the second resist regions 520, and it may be any one of square, rectangle, circle and ellipse for example. The shape of the second resist regions 520 shown in FIG. 5D is circle. Relatively speaking, the size H2 in the first direction (a direction parallel to the gate bars) of the second resist regions 520 is not critical, and it may be 10 nm-500 nm for example, as long as it does not cover the regions where the gaps are to be formed substantially; whereas the size W2 in the second direction (a direction perpendicular to the gate bars substantially) thereof is critical, and it is for example $1/10$-$15/10$ of the width of the space in the first photolithography process of the line/space type (for example, during etching, the second resist regions 520 may be trimmed to be reduced in its critical size such that the second resist regions 520 do not cover the regions where the gaps are to be formed). In addition, there is no particular limit to the size of the second resist regions 520, as long as a minimum length range in the first direction of the portions where the second resist regions 520 overlap with each gate material bar 560 or etching barrier bar 580 comprises at least a length range in the first direction of the gaps to be formed on the same straight line in the second direction (i.e., as long as the second resist regions 520 can cover the positions where the gaps need not to be formed in the gate material bars 560 in each stripe zone). In addition, there is no particular limit to the number of the gate bars which the second resist regions 520 are across, and it may be 1 to 5 for example, which is mainly dependent on the desired gate patterns. The number of the gate bars which the second resist regions 520 are across shown in FIG. 5D is 2.

Figure 5E:
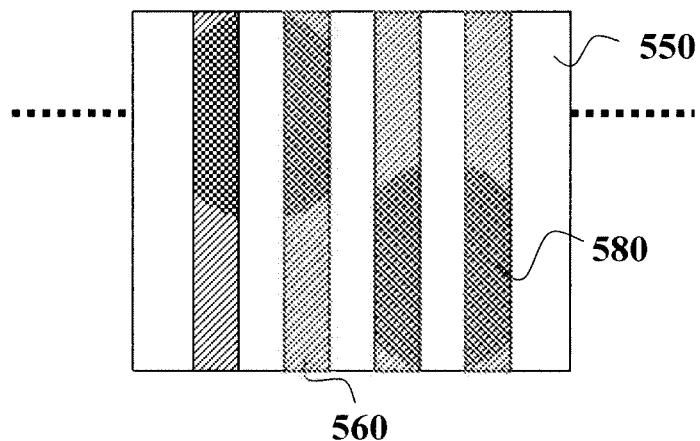
Figure 5F:
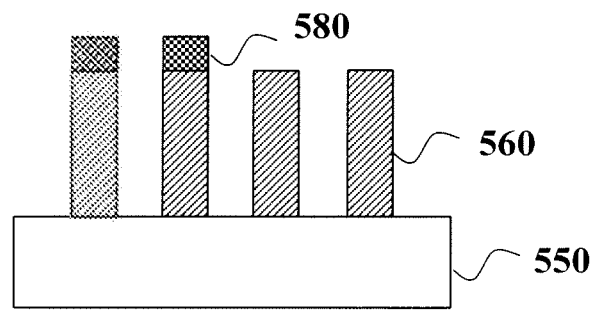

In step 460 of FIG. 4, the etching barrier bars 580 in the stacked structures are selectively removed by a second etching process with the second resist regions 520 as a mask (referring to FIGS. 5E-5F). Through the second etching process, the etching barrier bars 580 are selectively left between the positions where the gaps are to be formed in the gate bars, and the etching barrier bars 580 are selectively removed in regions including the positions where the gaps are to be formed in the gate bars so as to expose the underlying gate material bars 560. The second etching process is for example a standard dry etching process with a high etching selecting ratio, and the etching selecting ratio of the gate material bars 560 to the etching barrier bars 580 is for example in a range of 1:10 to 1:50.

In step 470 of FIG. 4, a third resist layer is formed on the substrate subjected to the second etching process.

Figure 5G:
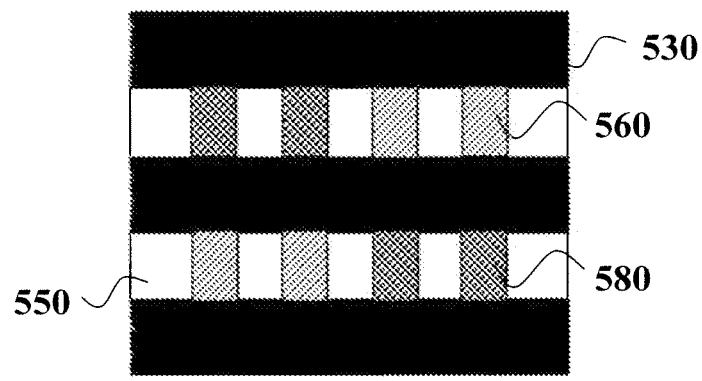

In step 480 of FIG. 4, the third resist layer is subjected to a third photolithography process to form a resist pattern 530 having a plurality of openings which are parallel to each other and extend continuously in the second direction (referring to FIG. 5G). It is to be noted that, while the resist pattern 530 exposes the gate material bars 560 at the positions where the gaps are to be formed, it also exposes the etching barrier bars 580 on the gate material bars 560 at the positions where the gaps are not to be formed on the same straight line in the second direction. However, since there are etching barrier bars 580 left after the second etching process on the gate material bars 560 at the positions where the gaps are not be to formed, the gate material bars 560 may be etched away only at the positions where the gaps need to be formed in the following third etching process. The third photolithography process is a line/space type photolithography process, for example, a ratio of the line to the space is in a range of 1:5 to 5:1, and a pitch is in a range of 20 nm to 2000 nm. A photolithography technique such as dry photolithography, emersion photolithography, EUV photolithography, electron beam photolithography or the like may be employed for the third photolithography process.

Figure 5H:
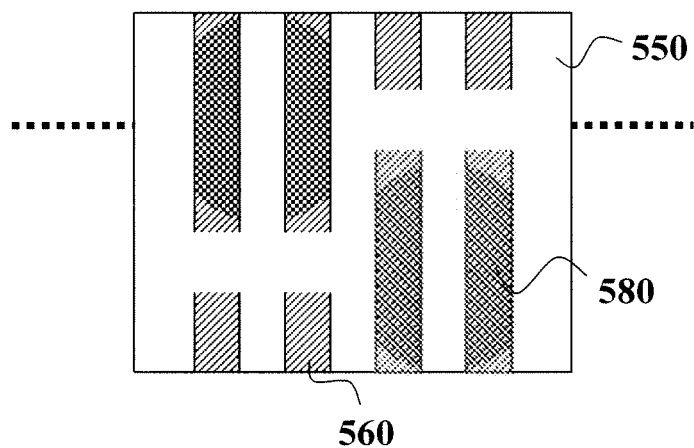
Figure 5I:
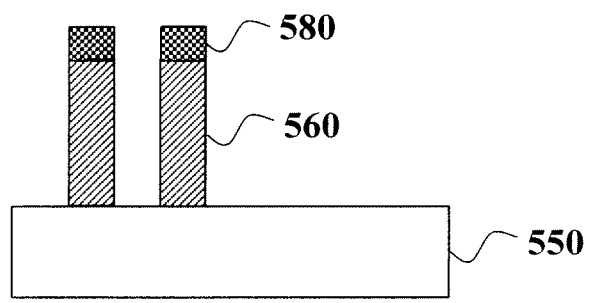

In step 490 of FIG. 4, gaps are formed in the gate materials bars 560 by a third etching process with the resist pattern 530 as a mask, thereby forming a staggered gate pattern (referring to FIGS. 5H-5I). The third etching process is for example a standard dry etching process with a high etching selecting ratio, and the etching selecting ratio of the etching barrier bars 580 to the gate material bars 560 is for example in a range of 1:10 to 1:200.

According to the method of the first embodiment of this disclosure, a semiconductor device having a gate pattern may be formed. As shown in FIGS. 5H-5I, the gate pattern includes a plurality of gate bars parallel to each other in the first direction, and each gate bar is broken up by gaps. The gaps are located in a plurality of stripe zones parallel to each other in the second direction which is substantially perpendicular to the first direction, and there are the gaps adjacent to each other across the gate bars in each stripe zone. Between the gaps adjacent to each other across the gate bars, etching barrier bars are formed on the gate bars.

After obtaining the staggered gate pattern according to the method of the first embodiment of this disclosure, optionally, the etching barrier bars 580 left on the gate bars may be removed.

In addition, optionally, the material of the gate bars may be further replaced with a metal so as to form a staggered metal gate pattern.

It can be seen from the above that, in the triple patterning technique of the first embodiment of this disclosure, since an etching barrier layer is introduced and the etching barrier layer is selectively left in advance between the positions where the gaps are to be formed, it is possible to form a plurality of incontinuous gaps in the same stripe zone integrally as one continuously extending gap, thereby changing the gate trimming pattern from a slot shape which is harder to be implemented by photolithography to a line/space shape which is easier to be implemented by photolithography. This makes the method of the first embodiment of this disclosure capable of having a larger photolithography process window and capable of better controlling the shape and size of the gate pattern.

Figure 1A:
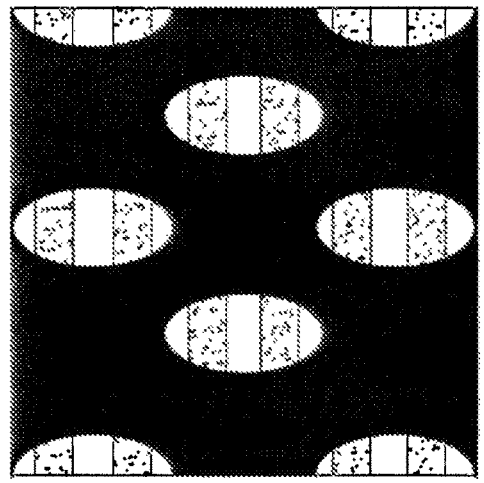
Figure 1B:
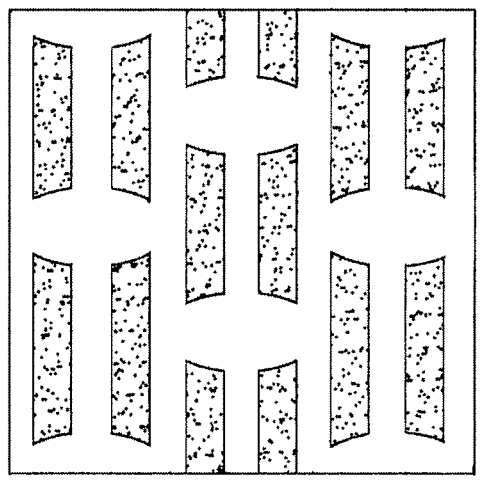
Figure 2A:
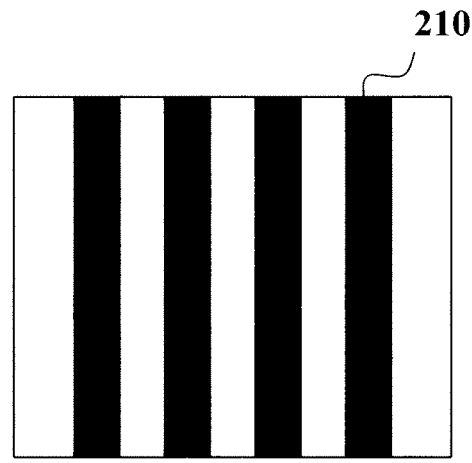
Figure 2B:
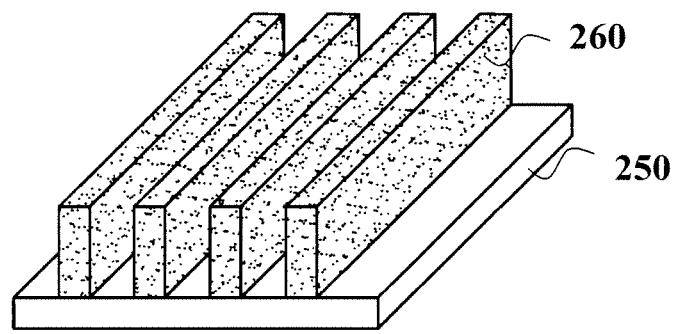
Figure 2C:
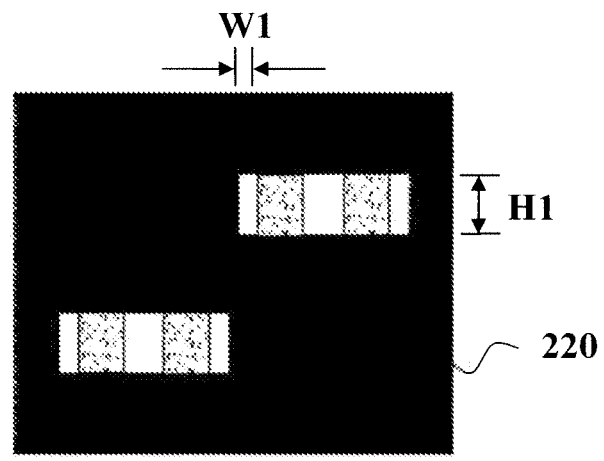
Figure 2D:
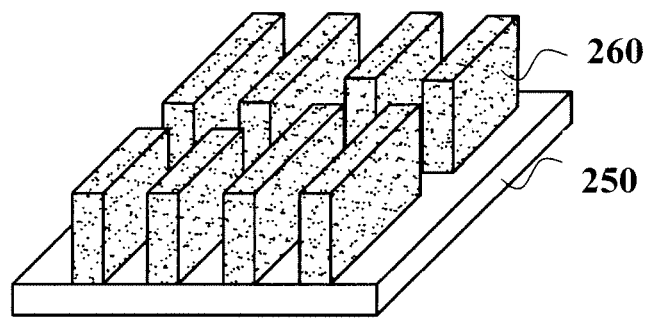
Figure 3A:
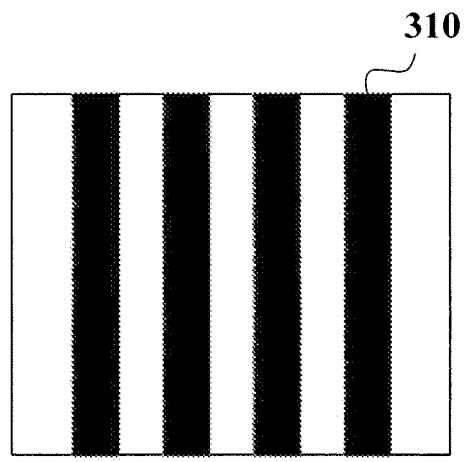
Figure 3B:
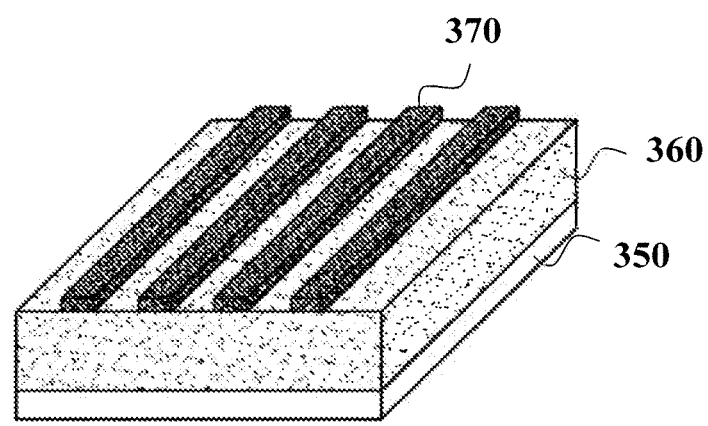
Figure 3C:
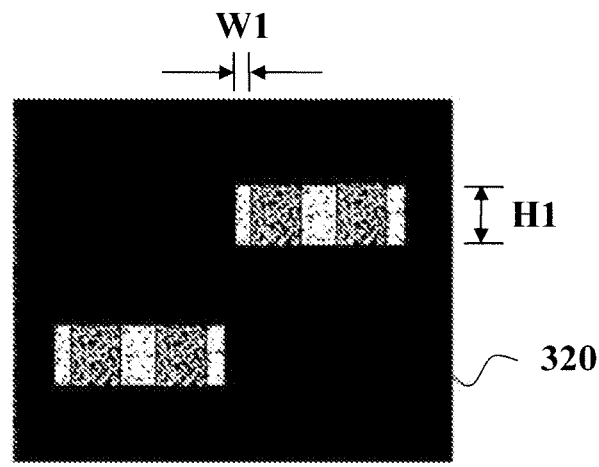
Figure 3D:
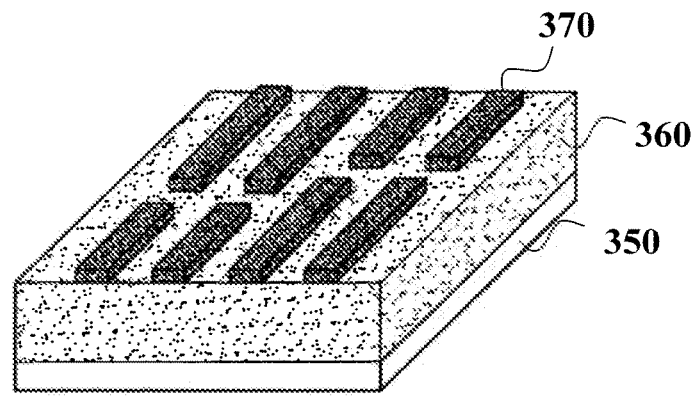
Figure 3E:
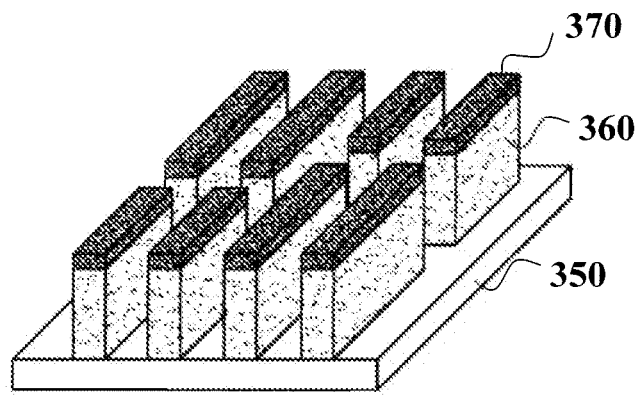

In the existing double patterning technique, referring to FIG. 2C and FIG. 3C, since the sizes of the trimming slots (in particular H1) are very small, strict control needs to be performed on them, which makes the photolithography process window of the trimming slots very small. In addition, the shape of the trimming slots within the range of the size W1 in FIG. 2C and FIG. 3C is very critical. For example, when the shape is not the desired rectangle (for example corners are rounded significantly) due to the margin of trimming slot photolithography, the shape and size of the obtained gate pattern may be affected, thereby affecting the performances of the semiconductor device. Further, if the material of the gate is to be replaced further with a metal, the filling of the metal is difficult to be performed. The present inventors have found out after investigation that, this process of forming trimming slots by one photolithography process so as to trim the gate bars is difficult to be applied to advanced semiconductor processes.

In contrast, in the triple patterning technique of the first embodiment of this disclosure, the etching barrier layer is employed and the gate bars are trimmed by employing two photolithography processes, which make the process of the first embodiment of this disclosure capable of having a larger photolithography process window (referring to H2 in FIG. 5D). In addition, the shape of the second resist regions 520 within the range of the size W2 in FIG. 5D is not critical, since it is enough so long as the second resist regions 520 can cover the underlying etching barrier bars 580 and gate material bars 560 so as to protect them from being etched away, and the shape of the second resist regions 520 within the range of the size W2 does not affect the shape and size of the obtained gate pattern. Further, in one of the photolithography processes (referring to FIG. 5G), since a line/space type which is easier to be implemented by photolithography is employed, the photolithography process can be performed relatively easily, and the shape and size of the gate pattern can be controlled better (for example, corners of the obtained gates are not sharp, but are desired right angles substantially), thereby reducing or substantially eliminating the adverse effect on the performances of the semiconductor device. Further, if the material of the gate is to be replaced further with a metal, the filling of the metal becomes relatively easier. Persons skilled in the art readily understand from the teaching herein that the triple patterning technique of the first embodiment of this disclosure can be applied to advanced semiconductor processes very well.

Second Embodiment

The second embodiment of this disclosure differs from the first embodiment in that, in the second embodiment, a hard mask layer is additionally formed on the gate material layer on the substrate, and then an etching barrier layer is formed on the hard mask layer; further, after forming a staggered pattern in the hard mask layer first by using a method similar to that of the first embodiment, the pattern is transferred to the underlying gate material layer.

Figure 6:
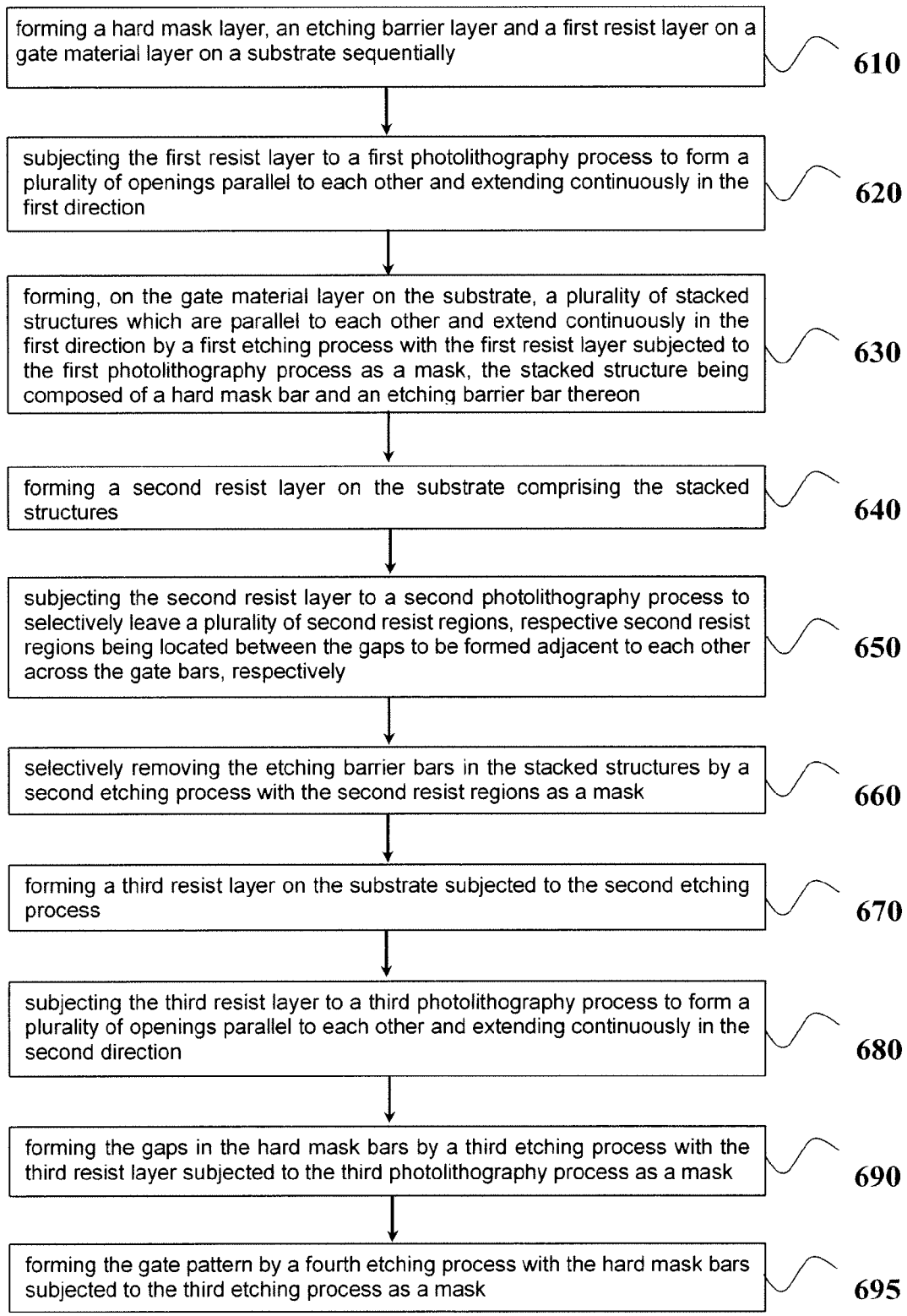
FIG. 6 schematically illustrates a flowchart of a method of forming a gate pattern according to a second embodiment of this disclosure.

FIG. 6 schematically illustrates a flowchart of the method of forming the gate pattern according to the second embodiment of this disclosure. FIGS. 7A-7K are plan views and section views schematically illustrating respective steps in the method of forming the gate pattern according to the second embodiment of this disclosure. The second embodiment of this disclosure will be described in detail with reference to FIG. 6 and FIGS. 7A-7K below.

First, a plurality of stacked structures which are parallel to each other and extend continuously in the first direction are provided on the gate material layer on the substrate, the stacked structure being composed of a hard mask bar and an etching barrier bar thereon. This can be obtained for example by steps 610~630 in FIG. 6.

Specifically, in step 610 of FIG. 6, a hard mask layer, an etching barrier layer and a first resist layer are formed on the gate material layer on the substrate sequentially. The substrate may be made of silicon for example, and a very thin gate oxide layer may be provided thereon (not shown in the drawings). The gate material layer may be made of polysilicon for example, and its thickness is 100 Å-1000 Å. The hard mask layer may be made of silicon oxide for example, and its thickness is 50 Å-1000 Å. The etching barrier layer may be made of silicon nitride for example, and its thickness is 50 Å-1000 Å.

Figure 7A:
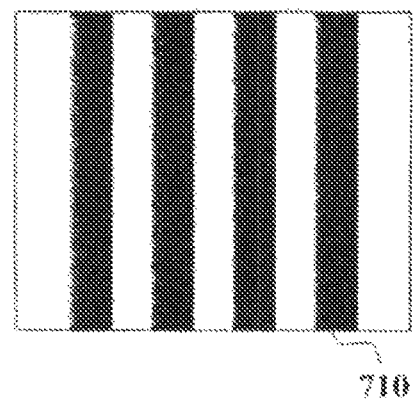

In step 620 of FIG. 6, the first resist layer is subjected to a first photolithography process to form a resist pattern 710 having a plurality of openings which are parallel to each other and extend continuously in the first direction (referring to FIG. 7A). The first photolithography process is a line/space type photolithography process, for example, a ratio of the line to the space is in a range of 1:5 to 5:1, and a pitch is in a range of 20 nm to 200 nm. A photolithography technique such as dry photolithography, emersion photolithography, EUV photolithography, electron beam photolithography or the like may be employed for the first photolithography process.

Figure 7B:
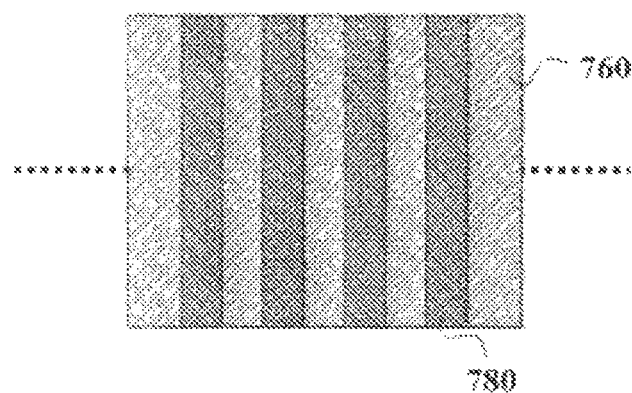
Figure 7C:
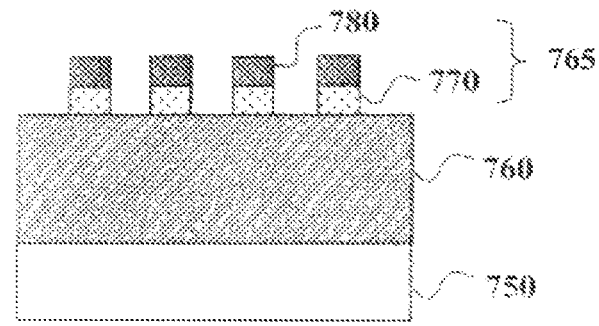

In step 630 of FIG. 6, the plurality of stacked structures 765 which are parallel to each other and extend continuously in the first direction are formed on the gate material layer 760 on the substrate 750 by a first etching process with the resist pattern 710 as a mask, the stacked structure being composed of a hard mask bar 770 and an etching barrier bar 780 thereon (referring to FIGS. 7B-7C). The first etching process is for example a standard dry etching process with a high etching selecting ratio, and the etching selecting ratio of the hard mask layer to the etching barrier layer and the etching selecting ratio of the gate material layer to the hard mask layer are for example in a range of 1:10 to 1:50.

Incidentally, after the first etching process, the resist pattern 710 may be ashed away in the same etching chamber. A standard process based on $O_2$ gas may be employed for the ashing for example. This can be applied to the following etching steps as well.

Incidentally, the middle of a pattern formed after the first etching process may be leveled off by using a leveling agent (such as BARC etc.), the leveling agent is ashed away after the next etching, and the middle of the pattern is leveled off again before a further next photolithography (not shown in the drawings).

Next, in step 640 of FIG. 6, a second resist layer is formed on the substrate comprising the stacked structures.

Figure 7D:
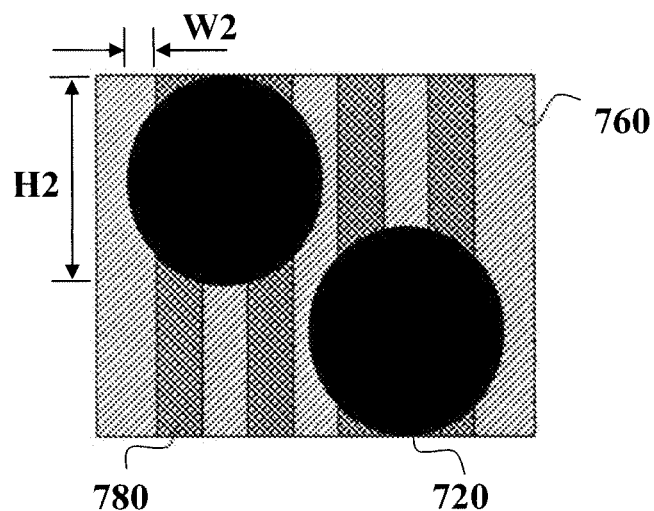

In step 650 of FIG. 6, the second resist layer is subjected to a second photolithography process to selectively leave a plurality of second resist regions 720, respective second resist regions 720 being located between the gaps to be formed adjacent to each other across the gate bars, respectively (referring to FIG. 7D). The stripe zones herein refer to the regions where the gaps breaking up the gate bars are located as described above. A photolithography technique such as dry photolithography, emersion photolithography, EUV photolithography, electron beam photolithography or the like may be employed for the second photolithography process. In addition, there is no particular limit to the shape of the second resist regions 720, and it may be any one of square, rectangle, circle and ellipse for example. The shape of the second resist regions 720 shown in FIG. 7D is circle. Relatively speaking, the size H2 in the first direction (a direction parallel to the gate bars) of the second resist regions 720 is not critical, and it may be 10 nm-500 nm for example, as long as it does not cover the regions where the gaps are to be formed substantially; whereas the size W2 in the second direction (a direction perpendicular to the gate bars substantially) thereof is critical, and it is for example 1/10-15/10 of the width of the space in the first photolithography process of the line/space type (for example, during etching, the second resist regions 720 may be trimmed to be reduced in its critical size such that the second resist regions 720 do not cover the regions where the gaps are to be formed). In addition, there is no particular limit to the size of the second resist regions 720, as long as a minimum length range in the first direction of the portions where the second resist regions 720 overlap with each hard mask bar 770 or etching barrier bar 780 comprises at least a length range in the first direction of the gaps to be formed on the same straight line in the second direction (i.e., as long as the second resist regions 720 can cover the positions where the gaps need not to be formed in the hard mask bars 770 in each stripe zone). In addition, there is no particular limit to the number of the gate bars which the second resist regions 720 are across, and it may be 1 to 5 for example, which is mainly dependent on the desired gate patterns. The number of the gate bars which the second resist regions 720 are across shown in FIG. 7D is 2.

Figure 7E:
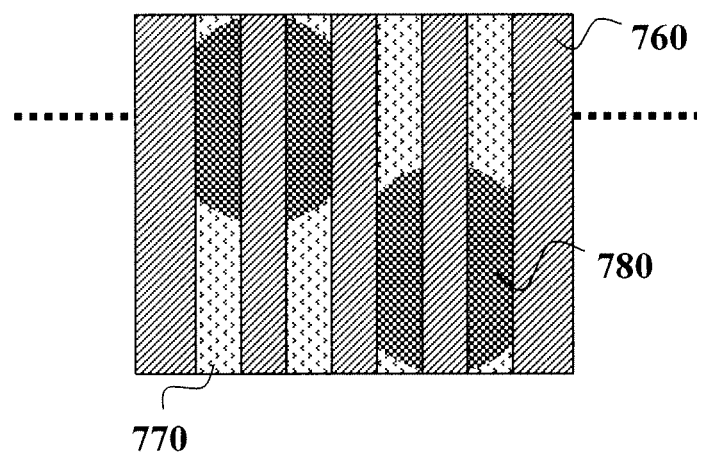
Figure 7F:
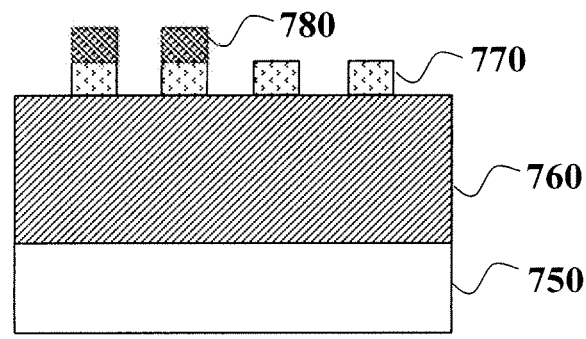

In step 660 of FIG. 6, the etching barrier bars 780 in the stacked structures are selectively removed by a second etching process with the second resist regions 720 as a mask (referring to FIGS. 7E-7F). Through the second etching process, the etching barrier bars 780 are selectively left between the positions where the gaps are to be formed in the hard mask bars, and the etching barrier bars 780 are selectively removed in regions including the positions where the gaps are to be formed in the hard mask bars so as to expose the underlying hard mask bars 770. The second etching process is for example a standard dry etching process, and the etching selecting ratio of the hard mask bars 770 to the etching barrier bars 780 is for example in a range of 1:2 to 1:50.

In step 670 of FIG. 6, a third resist layer is formed on the substrate subjected to the second etching process.

Figure 7G:
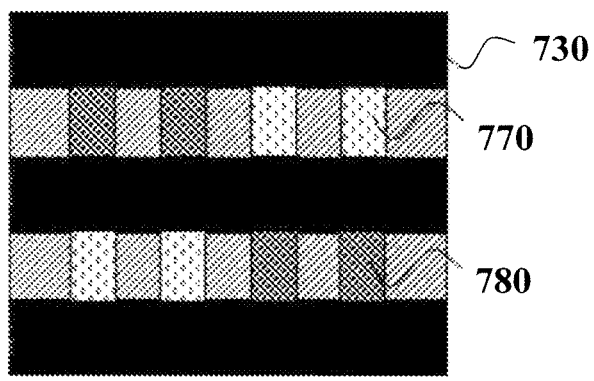

In step 680 of FIG. 6, the third resist layer is subjected to a third photolithography process to form a resist pattern 730 having a plurality of openings which are parallel to each other and extend continuously in the second direction (referring to FIG. 7G). It is to be noted that, while the resist pattern 730 exposes the hard mask bars 770 at the positions where the gaps are to be formed, it also exposes the etching barrier bars 780 on the hard mask bars 770 at the positions where the gaps are not to be formed on the same straight line in the second direction. However, since there are etching barrier bars 780 left after the second etching process on the hard mask bars 770 at the positions where the gaps are not be to formed, the hard mask bars 770 may be etched away only at the positions where the gaps need to be formed in the following third etching process. The third photolithography process is a line/space type photolithography process, for example, a ratio of the line to the space is in a range of 1:5 to 5:1, and a pitch is in a range of 20 nm to 2000 nm. A photolithography technique such as dry photolithography, emersion photolithography, EUV photolithography, electron beam photolithography or the like may be employed for the third photolithography process.

Figure 7H:
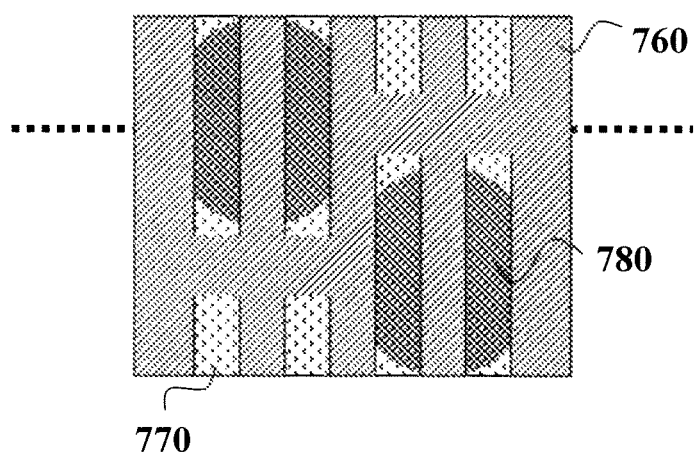
Figure 7I:
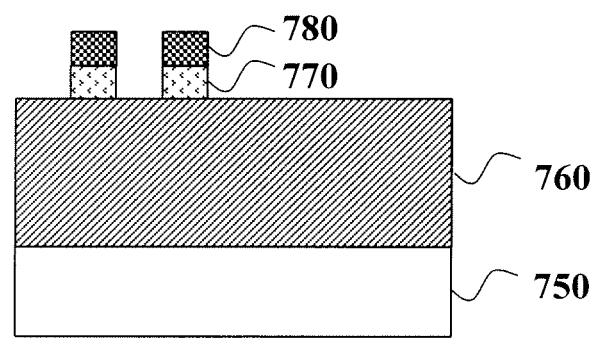

In step 690 of FIG. 6, gaps are formed in the hard mask bars 770 by a third etching process with the resist pattern 730 as a mask, thereby forming a staggered hard mask pattern (referring to FIGS. 7H-7I). The third etching process is for example a standard dry etching process, and the etching selecting ratio of the etching barrier bars 780 to the hard mask bars 770 is for example in a range of 1:50 to 1:200.

Figure 7J:
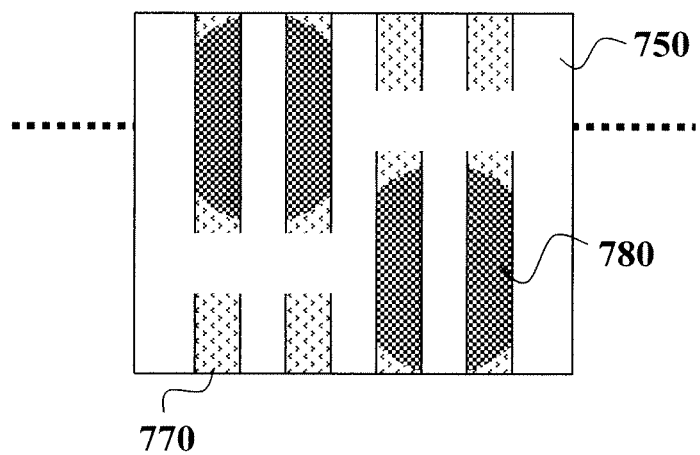
Figure 7K:
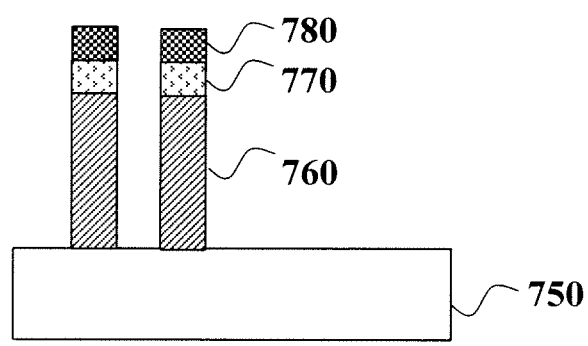

In step 695 of FIG. 6, the staggered hard mask pattern is transferred to the underlying gate material layer by a fourth etching process with the hard mask pattern as a mask, thereby forming a staggered gate pattern (referring to FIGS. 7J-7K). The fourth etching process is for example a standard dry etching process with a high etching selecting ratio, and the etching selecting ratio of the hard mask bars 770 to the gate material layer 760 is for example in a range of 1:10 to 1:200. There is no requirement of etching selecting ratio to the etching barrier bars 780, since the etching barrier bars 780 can be consumed entirely.

According to the method of the second embodiment of this disclosure, a semiconductor device having a gate pattern may be formed. As shown in FIGS. 7J-7K, the gate pattern includes a plurality of gate bars parallel to each other in the first direction, and each gate bar is broken up by gaps. The gaps are located in a plurality of stripe zones parallel to each other in the second direction which is substantially perpendicular to the first direction, and there are the gaps adjacent to each other across the gate bars in each stripe zone. Between the gaps adjacent to each other across the gate bars, etching barrier bars are formed on the gate bars.

After obtaining the staggered gate pattern according to the method of the second embodiment of this disclosure, optionally, the hard mask bars 770 and the etching barrier bars 780 left on the gate bars may be removed.

In addition, optionally, the material of the gate bars may be further replaced with a metal so as to form a staggered metal gate pattern.

Persons skilled in the art readily understand from the above teaching that the second embodiment of this disclosure can achieve all the advantageous technical effects of the first embodiment. Similarly, compared with prior art methods, the method of forming the gate pattern of the second embodiment of this disclosure is capable of having a larger photolithography process window and is capable of better controlling the shape and size of the gate pattern, thus is capable of being applied to advanced semiconductor processes very well.

While this disclosure has been described with reference to exemplary embodiments, it shall be understood that this disclosure is not limited to the described exemplary embodiments. It is obvious to persons skilled in the art that the above exemplary embodiments may be modified without deviating from the scope and spirit of this disclosure. The scope of the appended claims is to be accorded the broadest interpretation so as to encompass all such modifications and equivalent structures and functions.

What is claimed is:

1. A method of forming a gate pattern, the gate pattern including a plurality of gate bars parallel to each other in a first direction, each gate bar being broken up by gaps, the gaps being located in a plurality of stripe zones parallel to each other in a second direction which is substantially perpendicular to the first direction, and there being the gaps adjacent to each other across the gate bars in each stripe zone, wherein the method comprises the following steps:
providing, on a substrate, a plurality of stacked structures which are parallel to each other and extend continuously in the first direction, the stacked structure being composed of a gate material bar and an etching barrier bar thereon;
forming a second resist layer on the substrate comprising the plurality of stacked structures;
subjecting the second resist layer to a second photolithography process to selectively leave a plurality of second resist regions, respective second resist regions being located between the gaps to be formed adjacent to each other across the gate bars, respectively;
selectively removing the etching barrier bars in the plurality of stacked structures by a second etching process with the second resist regions as a mask;
forming a third resist layer on the substrate subjected to the second etching process;
subjecting the third resist layer to a third photolithography process to form a plurality of openings parallel to each other and extending continuously in the second direction; and
forming the gaps by a third etching process with the third resist layer subjected to the third photolithography process as a mask, thereby forming the gate pattern.

2. The method of forming the gate pattern according to claim 1, wherein the step of providing the plurality of stacked structures further comprises the following steps:
forming an etching barrier layer and a first resist layer on a gate material layer on the substrate sequentially;
subjecting the first resist layer to a first photolithography process to form a plurality of openings parallel to each other and extending continuously in the first direction; and
forming the etching barrier layer and the gate material layer into the plurality of stacked structures by a first etching process with the first resist layer subjected to the first photolithography process as a mask.

3. The method of forming the gate pattern according to claim 2,
wherein the first photolithography process is a photolithography process of a line/space type, the ratio of the line to the space is in a range of 1:5 to 5:1, and a pitch is in a range of 20 nm to 200 nm; and
wherein the third photolithography process is a photolithography process of a line/space type, the ratio of the line to the space is in a range of 1:5 to 5:1, and a pitch is in a range of 20 nm to 2000 nm.

4. The method of forming the gate pattern according to claim 2,
wherein the first etching process, the second etching process and the third etching process are dry etching processes.

5. The method of forming the gate pattern according to claim 4,
wherein the etching selecting ratio of the etching barrier layer to the gate material layer in the first etching process is in a range of 1:10 to 1:200;
wherein the etching selecting ratio of the gate material bars to the etching barrier bars in the second etching process is in a range of 1:10 to 1:50; and
wherein the etching selecting ratio of the etching barrier bars to the gate material bars in the third etching process is in a range of 1:10 to 1:200.

6. The method of forming the gate pattern according to claim 1, further comprising the following step:
replacing the material of the gate bars with a metal after forming the gate pattern.

7. The method of forming the gate pattern according to claim 1,
wherein the shape of the second resist regions obtained by the second photolithography process is any one of square, rectangle, circle and ellipse.

8. The method of forming the gate pattern according to claim 1,
wherein the materials of the gate material bars and the etching barrier bars are polysilicon and silicon oxide, respectively.

9. The method of forming the gate pattern according to claim 1, wherein the number of the gate bars between the gaps adjacent to each other across the gate bars is 1 to 5.

10. A method of forming a gate pattern, the gate pattern including a plurality of gate bars parallel to each other in a first direction, each gate bar being broken up by gaps, the gaps being located in a plurality of stripe zones parallel to each other in a second direction which is substantially perpendicular to the first direction, and there being the gaps adjacent to each other across the gate bars in each stripe zone, wherein the method comprises the following steps:

providing, on a gate material layer, said gate material layer on a substrate, a plurality of stacked structures which are parallel to each other and extend continuously in the first direction, the stacked structure being composed of a hard mask bar and an etching barrier bar thereon;

forming a second resist layer on the substrate comprising the plurality of stacked structures;

subjecting the second resist layer to a second photolithography process to selectively leave a plurality of second resist regions, respective second resist regions being located between the gaps to be formed adjacent to each other across the gate bars, respectively;

selectively removing the etching barrier bars in the plurality of stacked structures by a second etching process with the second resist regions as a mask;

forming a third resist layer on the substrate subjected to the second etching process;

subjecting the third resist layer to a third photolithography process to form a plurality of openings parallel to each other and extending continuously in the second direction;

forming gaps in the hard mask bars by a third etching process with the third resist layer subjected to the third photolithography process as a mask; and forming the gate pattern by a fourth etching process with the hard mask bars subjected to the third etching process as a mask.

11. The method of forming the gate pattern according to claim 10, wherein the step of providing the plurality of stacked structures further comprises the following steps:

forming a hard mask layer, an etching barrier layer and a first resist layer on the gate material layer on the substrate sequentially;

subjecting the first resist layer to a first photolithography process to form a plurality of openings parallel to each other and extending continuously in the first direction; and forming the etching barrier layer and the hard mask layer into the plurality of stacked structures by a first etching process with the first resist layer subjected to the first photolithography process as a mask.

12. The method of forming the gate pattern according to claim 11, wherein the first photolithography process is a photolithography process of a line/space type, the ratio of the line to the space is in a range of 1:5 to 5:1, and a pitch is in a range of 20 nm to 200 nm; and wherein the third photolithography process is a photolithography process of a line/space type, the ratio of the line to the space is in a range of 1:5 to 5:1, and a pitch is in a range of 20 nm to 2000 nm.

13. The method of forming the gate pattern according to claim 11, wherein the first etching process, the second etching process, the third etching process and the fourth etching process are dry etching processes.

14. The method of forming the gate pattern according to claim 13, wherein both the etching selecting ratio of the hard mask layer to the etching barrier layer and the etching selecting ratio of the gate material layer to the hard mask layer in the first etching process are in a range of 1:10 to 1:50;

wherein the etching selecting ratio of the hard mask bars to the etching barrier bars in the second etching process is in a range of 1:2 to 1:50;

wherein the etching selecting ratio of the etching barrier bars to the hard mask bars in the third etching process is in a range of 1:50 to 1:200; and wherein the etching selecting ratio of the hard mask bars to the gate material layer in the fourth etching process is in a range of 1:10 to 1:200.

15. The method of forming the gate pattern according to claim 10, further comprising the following step:

replacing the material of the gate bars with a metal after forming the gate pattern.

16. The method of forming the gate pattern according to claim 10, wherein the shape of the second resist regions obtained by the second photolithography process is any one of square, rectangle, circle and ellipse.

17. The method of forming the gate pattern according to claim 10, wherein the materials of the gate material layer, the hard mask bars and the etching barrier bars are polysilicon, silicon oxide and silicon nitride, respectively.

18. The method of forming the gate pattern according to claim 10, wherein the number of the gate bars between the gaps adjacent to each other across the gate bars is 1 to 5.

* * * * *